(12) United States Patent
Proot et al.

(10) Patent No.: US 11,909,427 B2
(45) Date of Patent: Feb. 20, 2024

(54) IMPEDANCE MATCHING

(71) Applicant: STMicroelectronics (Tours) SAS, Tours (FR)

(72) Inventors: Jean Pierre Proot, Saint Cyr sur Loire (FR); Pascal Paillet, Tours (FR); Francois Dupont, Tours (FR)

(73) Assignee: STMicroelectronics (Tours) SAS, Tours (FR)

( * ) Notice: Subject to any disclaimer, the term of this patent is extended or adjusted under 35 U.S.C. 154(b) by 0 days.

(21) Appl. No.: 18/113,796

(22) Filed: Feb. 24, 2023

(65) Prior Publication Data

US 2023/0198559 A1   Jun. 22, 2023

Related U.S. Application Data

(62) Division of application No. 17/321,757, filed on May 17, 2021, now Pat. No. 11,621,734.

(30) Foreign Application Priority Data

May 19, 2020   (FR) ...................................... 2005058

(51) Int. Cl.
*H04B 1/04* (2006.01)
*H03H 7/38* (2006.01)
*H04B 1/18* (2006.01)

(52) U.S. Cl.
CPC ............. *H04B 1/0458* (2013.01); *H03H 7/38* (2013.01); *H04B 1/18* (2013.01)

(58) Field of Classification Search
CPC .......... H03H 7/38; H03H 7/40; H04B 1/0458; H04B 1/18
See application file for complete search history.

(56) References Cited

U.S. PATENT DOCUMENTS

| | | | |
|---|---|---|---|
| 6,496,708 B1 | 12/2002 | Chan et al. | |
| 8,421,548 B2 | 4/2013 | Spears et al. | |
| 2007/0155347 A1 | 7/2007 | Heuermann et al. | |
| 2009/0231220 A1 | 9/2009 | Zhang et al. | |
| 2012/0038524 A1* | 2/2012 | Song ........................ | H03H 7/38 343/703 |

(Continued)

FOREIGN PATENT DOCUMENTS

EP    2472728 A1    1/2011

OTHER PUBLICATIONS

INPI Search Report and Written Opinion for priority application, FR 2005058, report dated Jan. 29, 2021 (9 pages).

*Primary Examiner* — Nguyen T Vo
(74) *Attorney, Agent, or Firm* — Crowe & Dunlevy

(57) ABSTRACT

A circuit device includes a directional coupler with a first port receiving a radiofrequency signal, a second port outputting a signal in response to signal received by the first port, and a third port outputting a signal in response to a reflection of the signal at the second port. An impedance matching network is connected between the second port and an antenna. The impedance matching network includes fixed inductive and capacitive components and a single variable inductive or capacitive component. A diode coupled to the third port of the coupler generates a voltage at a measurement terminal which is processed in order to select and set the inductance or capacitance value of the variable inductive or capacitive component.

23 Claims, 3 Drawing Sheets

(56) References Cited

U.S. PATENT DOCUMENTS

| | | | |
|---|---|---|---|
| 2013/0241665 A1* | 9/2013 | Kim | H03H 7/38 |
| | | | 361/278 |
| 2015/0365065 A1 | 12/2015 | Higaki et al. | |
| 2020/0119440 A1 | 4/2020 | Paulsen et al. | |
| 2020/0350940 A1 | 11/2020 | Backes et al. | |
| 2023/0102487 A1* | 3/2023 | Hopkins | H01J 37/32642 |
| | | | 315/111.21 |

* cited by examiner

IMPEDANCE MATCHING

CROSS REFERENCE TO RELATED APPLICATIONS

This application is a divisional of United States Application for patent Ser. No. 17/321,757, filed May 17, 2021, which claims the priority benefit of French Application for Patent No. 2005058, filed on May 19, 2020, the contents of which are hereby incorporated by reference in their entireties to the maximum extent allowable by law.

TECHNICAL FIELD

The present disclosure generally relates to electronic circuits, and more particularly to circuits comprising an antenna to transmit radiofrequency signals.

BACKGROUND

It is known to match the impedance of a radiofrequency antenna intended to transmit a radiofrequency signal with that of a radiofrequency source supplying the radiofrequency signal to be transmitted. In particular, known devices enable to match the impedance of an antenna with that of the radiofrequency source when the antenna is placed in its environment of use and that this environment causes an impedance mismatch between the radiofrequency source and the antenna.

However, such known devices suffer from various disadvantages.

There is a need to overcome all or part of the disadvantages of the previously-mentioned known impedance matching devices.

SUMMARY

One embodiment provides a device comprising: an antenna; a directional coupler comprising a first port configured to be connected to a source of a radiofrequency signal, a second port having a signal received by the first port transmitted towards it, and a third port having a signal received by the second port transmitted towards it; an impedance matching network comprising inductive and/or capacitive components of fixed value and a single inductive or capacitive value of settable value, an input terminal of the network being coupled to the second port of the coupler and an output terminal of the network being coupled to the antenna; and a diode coupling the third port of the coupler to a measurement terminal of the device configured to be connected to an analog-to-digital converter.

According to one embodiment, the matching impedance network is the single impedance matching network of the device.

According to one embodiment, the device further comprises a low-pass filter connected to the measurement terminal.

According to one embodiment, the component of settable value is a capacitor.

According to one embodiment, the matching impedance network comprises: a first capacitive component connected between input terminal of the network and a node configured to receive a reference potential; a first inductive component and a second capacitive component series connected between said input terminal and the output terminal of the network; a second inductive component connected between said output terminal and said node; and the component of settable value connected between said output terminal and said node.

According to one embodiment, values of the components of fixed value are determined so that the normalized impedance of the device after an impedance mismatch caused by a conductive element disposed close to the device belongs, in a Smith chart, to an area determined by all the values of the component of settable value.

One embodiment provides an electronic system comprising the described device.

According to one embodiment, the electronic system further comprises a source of a radiofrequency signal connected to the first port of the coupler of the device, and an analog to digital converter connected to the measurement terminal of the device.

According to one embodiment, the electronic system comprises a microcontroller comprising the analog to digital converter, a digital to analog converter controlling the component of settable value and a processor configured to receive measurements from the analog to digital converter and to provide a control signal to the digital to analog converter.

One embodiment provides a method of use of the described device or system, comprising the following successive steps: a) selecting an initial value of the component of settable value and measuring a voltage on the measurement terminal; and b) changing the value of the component of settable value in a determined scanning direction then measuring the voltage of the measurement terminal, step b) being repeated until the last measured voltage is strictly greater than the penultimate measured voltage.

According to one embodiment, step b) is followed by a step c) determining a set comprising each value of the component of settable value corresponding to a minimal voltage measurement, and controlling the component of settable value so that its value belongs to said set.

According to one embodiment, the component of settable value is controlled so that its value is a median value of said set.

According to one embodiment, the method comprises, previous to step a), a step of determining values of the components of fixed value of the network so that the normalized impedance of the device after an impedance mismatch caused by a conductive element disposed close to the device belongs, in a Smith chart, to an area determined by all the values of the component of settable value.

According to one embodiment, determining values of the components of fixed value comprises the following successive steps: 1) selecting values of the components of the network for which the impedance of the device matches that of the source of the radiofrequency signal in an anechoic environment; 2) calculating a normalized impedance of device for each value of the component of settable value; 3) disposing a conductive element close to the device and calculate a normalized impedance of the device; and 4) repeating step 2) and 3) with modifying at least one of the values selected at step 1) and/or those of the component of the network which has a settable value as long as the normalized impedance calculated at step 3) is outside a set comprising all the normalized impedance calculated at step 2).

According to one embodiment, steps a), b) and c) are implemented in a periodic manner and/or on request from a user.

BRIEF DESCRIPTION OF THE DRAWINGS

The foregoing features and advantages, as well as others, will be described in detail in the following description of specific embodiments given by way of illustration and not limitation with reference to the accompanying drawings, in which:

FIG. 1 shows, in the form of a circuit, an example of an impedance matching device.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the different circuits, for example, integrated, capable of being used as a source of a radiofrequency signal for an impedance matching device connected to an antenna, have not been described, the described embodiments and variants being compatible with usual sources of a radiofrequency signal.

In the following description, a signal is called radiofrequency (RF), for example, when the fundamental frequency of the signal is in the range from 3 kHz to 300 GHz, preferably from 100 MHz to 30 GHz. In the rest of the description, a so-called sub-gigahertz or sub-GHz RF signal is more particularly considered, that is, a radiofrequency signal having its fundamental frequency for example in the range from 400 MHz to 950 MHz, although the embodiments and variants which will be described more generally apply to all radiofrequency signals.

In the following description, a first value is said to be smaller, respectively greater, than a second value if the first value is smaller than or equal to, respectively greater than or equal to, the second value. In addition, a first value is said to be strictly smaller, respectively strictly greater, than a second value if the first value is smaller than and different from, respectively, greater than and different from, the second value.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
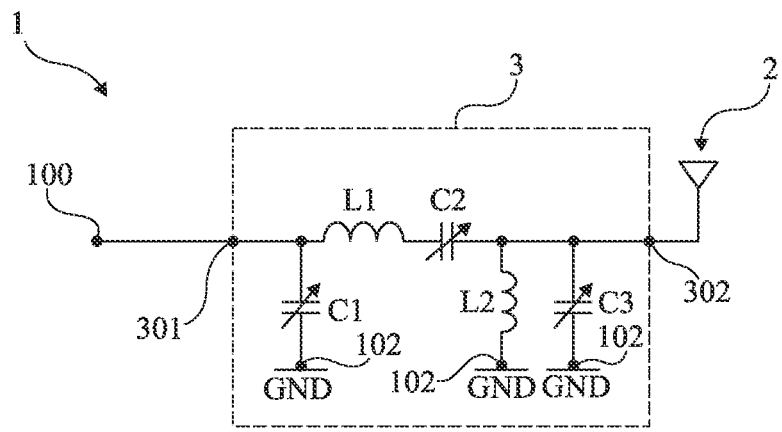

FIG. 1 shows in the form of a circuit an example of an impedance matching circuit device 1.

Device 1 comprises an antenna 2 and an input terminal 100, having an impedance matching network 3 connected therebetween. Terminal 100 is configured to be connected to a source (not shown) of a sub-GHz RF signal intended to be transmitted by antenna 2. The source of the sub-GHz RF signal is, for example, an integrated circuit (not shown) having an output terminal configured to deliver the sub-GHz RF signal to be transmitted, this output terminal being then connected to terminal 100.

Network 3 comprises capacitive components and/or inductive components or, in other words, comprises at least one inductive component and/or at least one capacitive component. The inductive and/or capacitive components of network 3 are coupled together and to a node 102 of application of a reference potential, typically ground GND. The inductive and/or capacitive components of network 3 couple an input terminal 301 of network 3 to an output terminal 302 of network 3. Terminals 301 and 302 are respectively connected to terminal 100 and to antenna 2. At least two inductive and/or capacitive components of network 3 have a settable value, that is, a controlled value. In other words, those components are variable components.

In the example of FIG. 1, network 3 more particularly comprises a variable capacitor C1 of settable capacitance value connected between terminal 301 and node 102, a fixed inductor L1 of fixed inductance value and a variable capacitor C2 of settable capacitance value series connected between terminals 301 and 302, the inductor L1 being connected to terminal 301, and a fixed inductor L2 of fixed inductance value and a variable capacitor C3 of settable capacitance value connected in parallel between terminal 302 and node 102.

When the terminal 100 of device 1 is connected to a radiofrequency source (not shown) of a sub-GHz RF signal, the capacitance values of variable capacitors C1, C2, and C3 of network 3 are modified during an impedance matching phase so that the impedance seen by the sub-GHz RF signal on terminal 100 is equal or substantially equal to the conjugated impedance of the source of the sub-GHz RF signal. More exactly, the capacitance values of variable capacitors C1, C2, and C3 are modified so that the power of the sub-GHz RF signal which is reflected by device 1 towards terminal 100 is as low as possible for the considered network 3. In other words, the capacitance values of variable capacitors C1, C2, and C3 are modified so that the impedance of device 1 is matched with that of the source of the sub-GHz RF signal.

For this purpose, device 1 is associated with a detector (not shown) configured to provide a measurement representative of the power of the signal reflected towards terminal 100, that is, representative of the power of a portion of the sub-GHz RF signal supplied to terminal 100 towards antenna 2 which is reflected towards terminal 100. The detector should be sufficiently sensitive to measure the power of the reflected signal, or reflected power, when the impedance of device 1 is matched with that of the source and the reflected power is minimal.

Such a detector, typically a logarithmic detector, is complex and costly to implement. It would thus be desirable to be able to implement an impedance matching phase with a simpler detector.

It is here considered that the impedance of device 1 is initially matched with the one of the source of the sub-GHz RF signal and that the impedance of device 1 is modified because of the environment where the device 1 is disposed. As a result, the impedance of device 1 has a mismatch with that of the source. To suppress such an impedance mismatch, an impedance matching phase is then implemented in situ, that is, in the environment of use of device 1.

During this impedance matching phase, since network 3 comprises at least two variable components of settable (capacitance and/or inductance) value, the reflected power exhibits a plurality of local minimum values when the values of the components are varied, each local minimum corresponding to a different association or combination of values of the variable components of settable value. As a result, the implementation of an impedance matching phase requires trying a very large number of combinations of values of the variable components of settable value to find the minimum reflected power, that is, that of the local minimum values corresponding to the lowest reflected power. The duration of an impedance matching phase implemented with a device such as device 1 is thus significant.

A long impedance matching phase is not desirable, particularly when device 1 and the source of the sub-GHz RF signal belong to an electronic system powered by a battery. Indeed, during the impedance matching phase, the source transmits the sub-GHz RF signal at the maximum power that it can supply so that the reflected power remains measurable by the detector, even when the impedance of device 1 is matched with that of the source and this reflected power has a minimum value.

As a result, an impedance matching phase implemented with device 1 is highly power-consuming. It would thus be desirable to be able to decrease the duration of the impedance matching phase, to decrease the power consumption that it generates.

Figure 2:
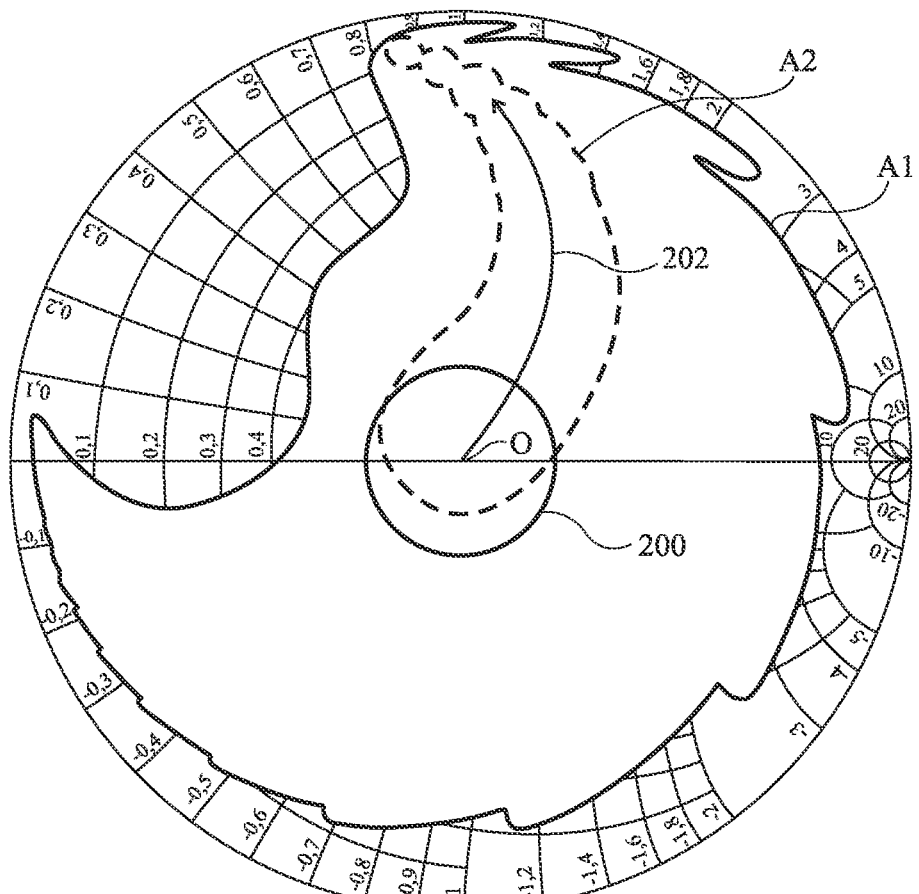
FIG. 2 shows, in a Smith chart, impedance shifts that the device of FIG. 1 is capable of correcting.

FIG. 2 shows, by means of a Smith chart, the impedance shifts that device 1 is capable of correcting.

Smith charts are well known by those skilled in the art. A Smith chart particularly enables to represent the impedance of a load, here, the impedance of device 1, normalized with respect to a reference impedance, here, the impedance of the source of the sub-GHz RF signal. The impedance of device 1 normalized by that of the source is also called normalized impedance of device 1. The center O if the chart corresponds to the case where the two impedances are equal, for example, to 50 ohms.

In a Smith chart, the set of decreased impedances belonging to a same circle centered on center O of the chart correspond to a same coefficient of reflection of a signal on the load, that is, in this example, to a same coefficient of reflection of a radiofrequency signal on device 1, the signal being supplied by the radiofrequency source connected to the terminal 100 of device 1. When the coefficient is expressed in dB, it is currently designated by initials RL, for Return Loss. The normalized impedances arranged inside of such a circle correspond to RL coefficients smaller than that of the normalized impedances arranged on the circle.

FIG. 2 shows a circle 200 corresponding to the normalized impedances of device 1 for which the RL coefficient is equal to a threshold RLth, threshold RLth being preferably smaller than −5 dB, for example equal to −13 dB in this example. In the following description, it is, for example, considered that the impedance of device 1 matches that of the source delivering the sub-GHz RF signal to terminal 100 if the normalized impedance of device 1 is arranged on or inside of circle 200, that is, if the normalized impedance corresponds to a RL coefficient smaller than or equal to threshold RLth.

FIG. 2 shows, by an area A1 delimited by a full line, the set of normalized impedances device 1 which may be corrected by the implementation of an impedance matching phase carried out in situ, that is, which may be taken into circle 200 by appropriately modifying the values of the variable components of settable value of network 3 of device 1. In other words, area A1 represents the set of impedance mismatches that device 1 is capable of correcting to recover an impedance which matches that of the source. In yet other words, area A1 represents the set of normalized impedances that device 1 can take.

The inventors have observed that the impedance shifts of a device of the type of device 1 caused by the environment of use of the device 1, that is the environment where the device 1 is disposed to be used therein, result from the presence of a conductive element close to the device, for example, for example a metallic element, for example a pipe.

Further, when the impedance of device 1 matches that of source and device 1 undergoes an impedance mismatch caused by a conductive element close to the device, the normalized impedance of device 1 represented in a Smith chart is displaced from the center of the chart to the edge of the chart. The inventors have observed that this displacement of the normalized impedance of device 1 approximatively follows a same direction, shows by an arrow 202 in FIG. 2, whatever the conductive element causing the mismatch is and whatever the position of the conductive element relative to device 1 is as soon as the conductive element is close enough to modify the impedance of device 1. In other words, the mismatches of impedance that device 1 having a given configuration of network 3 and a given antenna 2 undergoes are predictable as they follow this direction 202.

The inventors here provide taking advantage of the fact that the impedance mismatches of a device of the type in FIG. 1 comprising a given network 3 and a given antenna 2 are predictable. In particular, the inventors suggest to keep only one variable component of settable value in the impedance matching network of the device.

Figure 3:
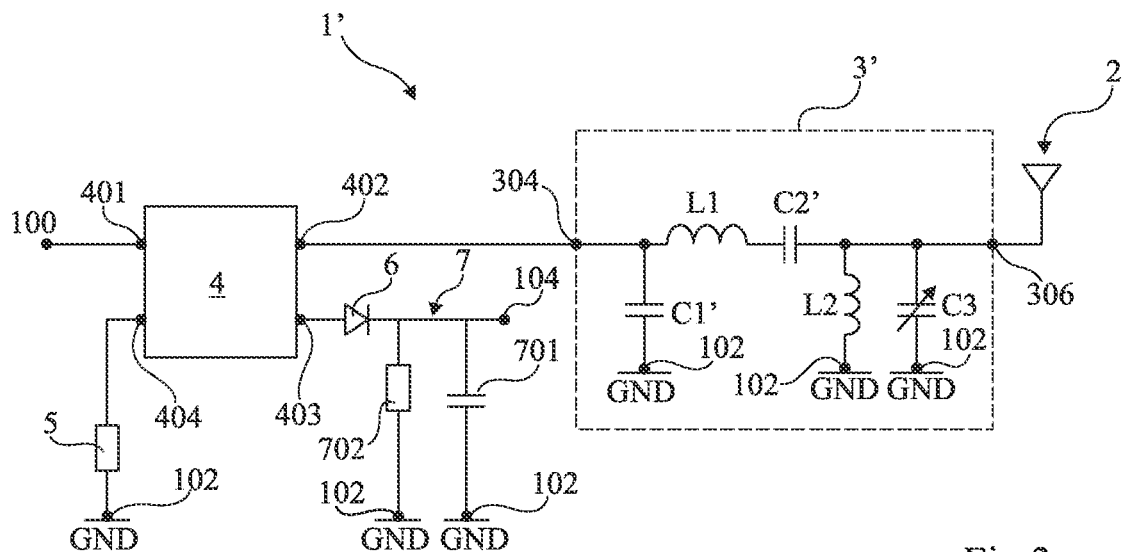
FIG. 3 shows in the form of a circuit an embodiment of an impedance matching device.

FIG. 3 shows in the form of a circuit an embodiment of an impedance matching device 1'.

Device 1' is similar to the device 1 of FIG. 1 in that it comprises antenna 2, terminal 100, and an impedance matching network 3' coupling terminal 100 to antenna 2. The network 3' of device 1' is the single impedance matching network of device 1'.

Network 3' comprises, like the network 3 described in relation with FIG. 1, inductive components, and/or capacitive components coupled together and to node 102. The inductive and/or capacitive components of network 3' couple an input terminal 304 of network 3' to an output terminal 306 of network 3', terminals 304 and 306 being respectively coupled to terminal 100 and to antenna 2, terminal 306 being preferably connected to antenna 2.

Network 3' differs from network 3 in that it comprises a single variable inductive or capacitive component of settable value, the set of other inductive and/or capacitive components of network 3' having a fixed value.

According to an embodiment, the variable component of settable value is a capacitor, variable capacitors of settable capacitance value being simpler to implement than variable inductors of settable inductance value. In an alternative embodiment, that variable component of settable value could instead be an inductor.

According to an embodiment, the components of network 3' are discrete components assembled on a printed circuit board.

In the example of FIG. 3, network 3' comprises a fixed capacitor C1' of fixed capacitance value connected between terminal 304 and node 102, a fixed inductor L1 of fixed inductance value, and a fixed capacitor C2' of fixed capacitance value connected between terminals 304 and 306, inductor L1 being connected to terminal 304, and a fixed inductor L2 of fixed inductance value and a variable capacitor C3 of settable capacitance value connected in parallel between terminal 306 and node 102.

The capacitance and inductance values of the fixed components of fixed value of network 3' are determined so that the normalized impedance of the device 1' submitted to an impedance mismatch caused by a conductive element close to the device 1' belongs, in a Smith chart, to an area corresponding to the set of possible capacitance or inductance values of the variable component of settable value of network 3', this area comprising to the center O of the chart. In other words, the capacitance and inductance values of the fixed components of fixed value of the network 3' are determined so that the normalized impedance of device 1' submitted to an impedance mismatch caused by a conductive element belongs to the set of normalized impedances the device 1' can take when the capacitance or inductance value of the variable component of settable value is modified. In yet other words, the values of the components of fixed value of network 3' are determined so that an impedance mismatch of device 1' caused by a conductive element is correctable by a modification of the value of its variable component of settable capacitance or inductance value.

As an example, for a given network 3' and a given antenna 2, the capacitance and inductance values of the fixed components of fixed value are determined by implementing, for example with a simulation tool, the following successive steps:
1) select capacitance and inductance values of components of network 3' allowing to match the device 1' impedance with that of the source of the sub-GHz RF signal when device 1' is in an anechoic environment;
2) determine, for these selected capacitance and inductance values, the set of the normalized impedances of device 1' corresponding to the set of the possible capacitance or inductance values of the variable component of settable value;
3) induce one or more impedance mismatches by a conductive element and determine, for each of these impedance mismatches, the normalized impedance of device 1'; and
4) verify if each normalized impedance determined at step 3) is included in the set of the normalized impedances of device 1' determined at step 2). In other words, step 4) comprises verifying if the normalized impedance calculated at step 3) belongs, in a Smith chart, to an area representing the set of the normalized impedances taken by device 1' when the whole range of the possible capacitance or inductance value of the variable component of settable value is scanned.

Steps 2) and 3) are repeated after having modified at least one of the values selected at step 1) and/or those of the network variable components which has a settable value as long as each normalized impedance calculated at step 3) is outside the set of the normalized impedances calculated at step 2). When each normalized impedance calculated at step 3) belongs to the set of the normalized impedances calculated at step 2), the determination of the capacitance and inductance values of the fixed components of fixed value of the network 3' is finished. The determined capacitance and inductance values are the ones used during the last implementation of the steps 2) and 3)).

Those skilled in the art are capable of determining the capacitance and inductance values of the fixed components of fixed value of the network in a different manner than that described above as an example.

Referring again to FIG. 2, an area A2 delimited by dotted lines represents the set of normalized impedances of device 1' which correspond to the set of possible capacitance or inductance values of the variable component of settable value of network 3'. In FIG. 2, the area A2 is represented for the case where the capacitance and inductance values of the fixed components of fixed value of network 3' have been determined indicated previously. Thus, when device 1' undergoes an impedance mismatch caused by a conductive element of its environment, the normalized impedance of device 1' moves in direction 202. When the normalized impedance of device 1' stays in the area A2, an appropriate modification of the capacitance value of variable capacitor C3 enables to take the normalized impedance of device 1' into circle 200. In other words, when the normalized impedance of device 1' having undergone an impedance mismatch stay in area A2, an impedance matching phase enables to take the normalized impedance of device 1' into circle 200, that is to say enable to readjust the impedance of device 1' with that of the source of the sub-GHz RF signal.

Due to the fact that the impedance matching network 3' of device 1' comprises a single variable component of settable value, the duration of an impedance matching phase implemented with device 1' is shorter than that of an impedance matching phase implemented with a device of the type of device 1 having its impedance matching network comprising at least two variable components of settable value.

Further, due to the fact that network 3' comprises a single variable capacitor C3 of settable value, when the capacitance value of capacitor C3 is varied, the reflected power has a single minimum value, instead of a plurality of local minimum values as in a device of the type of the device 1.

The inventors here provide taking advantage of the fact that there is a single minimum reflected power when the value of variable capacitor C3 varies to use a measurement circuit or detector less sensitive than those necessary for the implementation of an impedance matching phase in a device of the type of that of FIG. 1.

Indeed, in a device of the type of the device 1, as there are a plurality of local minimums of the reflected power, it is necessary to know the values of these local minimums to determine which of these local minimums corresponds to the lowest reflected power. The impedance matching is then made by controlling the capacitance or inductance values of the variable components of settable value of the network 3 so that their values are those corresponding to the local minimum for which the reflected power is the lowest. On the contrary, in device 1', as there is only one minimum of the reflected power, it is not necessary to precisely known the corresponding value of the reflected power.

According to an embodiment, as illustrated in FIG. 3, the detector of device 1' comprises a directional coupler 4. Coupler 4 comprises a port 401 configured to be connected to the source of a sub-GHz RF signal, port 401 being coupled, preferably connected, to terminal 100. Coupler 4 further comprises a port 402. Coupler 4 is configured to transmit to port 402 a sub-GHz RF signal received by its port 401. Port 402 is coupled, preferably connected, to the terminal 304 of network 3'. Coupler 4 further comprises a port 403. Coupler 4 is configured to transmit the sub-GHz RF signal received by its port 402 to port 403. The sub-GHz RF signal received by port 402 corresponds to the sub-GHz RF signal reflected by the assembly of network 3' and of antenna 2, the reflected signal propagating towards terminal 100. The signal on port 403 corresponds, in practice, to an attenuated version of the signal received by the port 402. This attenuation results from the coupling losses between ports 402 and 403, and is, for example, in the order of 20 dB.

In the example of FIG. 3, coupler 4 further comprises a port 404, towards which an attenuated version of the signal received by port 401 is transmitted. This attenuation results from the coupling losses between ports 401 and 404, and is, for example, equal to that between port 402 and 403. A resistor 5 is connected between ports 404 and node 102 to match the impedance viewed by port 404 to that of port 404 of coupler 4, which is, in practice, equal to that of the source of the sub-GHz RF signal.

According to another example, not shown, coupler 4 does not comprise port 404 and the resistor 5 then forms part of coupler 4.

According to an embodiment where the components of network 3' are discrete components assembled on a printed circuit board, coupler 4 is a discrete component assembled on the same printed circuit board.

The detector of device 1' further comprises a diode 6 coupling port 403 to a measurement terminal 104 of device 1'. An electrode of diode 6, its anode, is coupled, preferably connected, to port 403, the other electrode of diode 6, its cathode, is coupled, preferably connected, to terminal 104.

Diode 6 is configured to rectify the sub-GHz RF signal present on port 403 and to deliver a corresponding rectified voltage Vmes to terminal 104.

According to an embodiment where the components of network 3' are discrete components assembled on a printed circuit board, diode 6 is, preferably, a discrete component assembled on the same printed circuit board.

The detector of device 1' further comprises a low-pass filter 7 connected to terminal 104. The filter 7 is configured to smooth the rectified voltage Vmes present on terminal 104, so that voltage Vmes 104 is a DC voltage. In the example, the low-pass filter 7 comprises a capacitor 701 connected between terminal 104 and node 102, and a resistor 702 connected between terminal 104 and node 702, in parallel with the capacitor 701. The value of the resistor 702 is chosen to make the impedance viewed by port 104 equal to that of port 403 of coupler 4.

According to an embodiment where the components of network 3' are discrete components assembled on the printed circuit board, filter 7 is preferably formed of one or a plurality of discrete components assembled on the same printed circuit board.

Voltage Vmes is representative of the reflected power. More particularly, the higher, respectively the lower, value of voltage Vmes is, the higher, respectively the lower, the reflected power, voltage Vmes being minimal when the reflected power is minimal, that is to say when the impedance of the device 1' matches that of the radiofrequency source connected to terminal 100.

Figure 4:
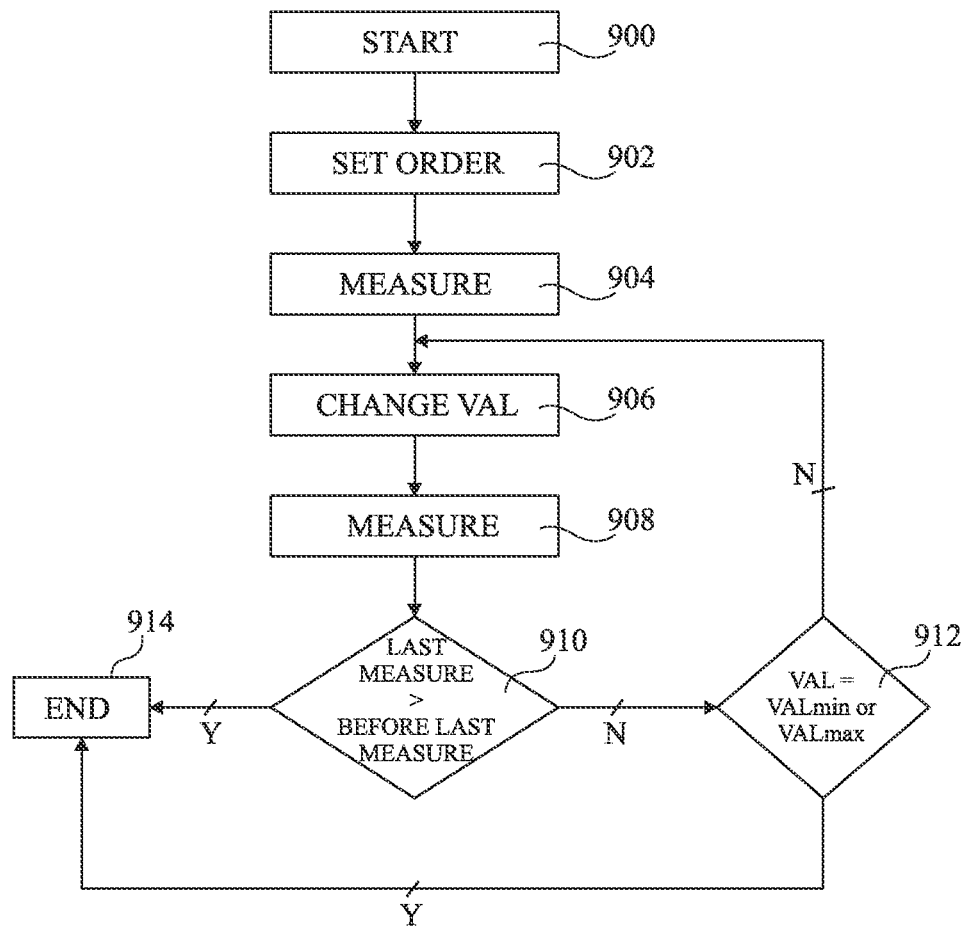
FIG. 4 illustrates, in the form of a flowchart, an implementation mode of a method of use of the device of FIG. 3.

Measurement terminal 104 is configured to be connected to an analog-to-digital converter (ADC) that is not shown in FIG. 4. The ADC, when it is connected to terminal 104, forms part of the detector of device 1'. The ADC is configured to deliver a signal or digital code over a plurality of bits, the digital code being representative of the value of voltage Vmes, and thus of that of the reflected power.

The ADC comprises a conversion range delimited by a maximum voltage Vmax and a minimum voltage Vmin. If the voltage Vmes on terminal 104 has a value greater than or equal to voltage Vmax, the ADC will indicate that the measured voltage Vmes is equal to voltage Vmax. If the voltage Vmes on terminal 104 has a value smaller than or equal to voltage Vmin, the ADC will indicate that the measured value Vmes is equal to voltage Vmin. Voltage Vmin determines the maximum sensitivity of the detector, that is, the minimum power of the signal delivered by port 403 to the detector which results in a voltage Vmes on terminal 104 in the conversion range of the ADC.

During an impedance matching phase carried out in situ, voltage Vmes is greater than voltage Vmin as long as the coefficient RL is greater than a threshold RLlim (in dB) determined by relation RLlim=Ds+C−Pi, Ds being the maximum sensitivity of the detector in dBm, Pi being the power of the signal delivered to terminal 100 in dBm, and C representing the coupling losses between ports 402 and 403 in dB.

As an example, threshold RLlim is equal to −13 dB when power Pi is equal to 10 dBm, the coupling losses C are equal to 20 dB, and the maximum sensitivity Ds is equal to −23 dBm.

According to an embodiment, the ADC of device 1' belongs to a microcontroller (not shown) configured to implement an impedance matching phase by use of device 1'. Preferably, the microcontroller comprises a digital-to-analog converter or DAC, configured to control the variable component of settable value (for example, capacitor C3) of network 3'. Preferably, the microcontroller also comprises a microprocessor receiving data from the ADC and supplying data to the DAC to control the setting of the capacitance and inductance value of the variable component.

FIG. 4 illustrates, in the form of a flowchart, an embodiment of a method of use of device 1'. This method of use corresponds, in practice, to a method for matching in situ the impedance of device 1' with that of the radiofrequency source connected to the terminal 101 of device 1'.

In that method, the capacitance or inductance value of the variable component is varied and the voltage Vmes is measured for each value taken by the variable component as long as the measured voltage Vmes is decreasing or constant, and the variation of the variable component value is stopped as soon as the measured voltage Vmes is strictly increasing. This makes it possible to measure the voltage Vmes over only part of the range of possible values of the variable component, which makes it possible to reduce the time necessary for the implementation of the method. We take advantage here of the fact that the reflected power has only one minimum when the value of the variable component varies.

At a step 900 (block "START"), an initial capacitance value Cinit of the variable capacitor C3 is selected. As an example, the value Cinit is the current value of the variable capacitor C3 at the beginning of the method, its maximum value Cmax or its minimal value Cmin, preferably its current value. At step 900, the capacitance and inductance values of the fixed components of fixed value of network 3' have been (beforehand) set as previously described, and the assembly of the device 1' and of the radiofrequency source connected to the terminal 100 (FIG. 3) is in its environment of use. In practice, device 1' then forms part of an electronic system comprising the ADC connected to terminal 104 and a circuit for controlling the variable component of settable value of network 3'.

At a next step 902 (block "SET ORDER"), a scanning direction, or scrolling direction, of the capacitance values of the variable capacitor C3 from the value Cinit is determined among the increasing direction and the decreasing direction. More particularly, the increasing or decreasing order of the successive capacitance values of the variable capacitor C3 is determined so that, during the following steps of the method, at least the first two measured values of the voltage Vmes are decreasing, or, in other words, are not strictly increasing.

The implementation of this step is in the abilities of those skilled in the art, for example by selecting a scanning direction, by measuring, for this scanning direction, voltage Vmes for at least the first two successive capacitance values of the variable capacitor C3, by verifying if the selected scanning direction corresponds to a decreasing measured voltage Vmes, and by modifying the scanning direction if needed.

At a next step 904 (block "MEASURE"), the voltage Vmes on the terminal 104 is measured for the Cinit value of the variable capacitor C3. It will be noted that, if the previous step 902 includes a measurement of the voltage Vmes on the terminal 104 for the Cinit value, this step 904 can be omitted.

At a next step 906 (block "CHANGE VAL"), the capacitance value of variable capacitor C3 is modified while respecting the scanning direction fixed at step 902.

At a next step 908 (block "MEASURE"), the voltage Vmes on terminal 104 is measured for the current capacitance value of variable capacitor C3.

At a next step 910 (block "LAST MEASURE>BEFORE LAST MEASURE"), it is verified whether the last measured voltage Vmes is strictly greater than the penultimate measured voltage Vmes. We call here "measured voltage Vmes" the measurement or value of the voltage Vmes which is supplied by the ADC connected to terminal 104. A measured voltage Vmes may correspond to a value different from that of the voltage Vmes actually present on the terminal 104, typically when the voltage Vmes on terminal 104 is outside the ADC conversion range.

If the last voltage Vmes measured is not strictly greater than the penultimate voltage Vmes measured (branch N of block 910), the method continues at step 912 (block "VAL=VALmin or VALmax"). If the last measured voltage Vmes is strictly greater than the penultimate measured voltage Vmes (branch Y of block 910), the method continues at a step 914 (block "END").

At step 912, it is verified whether the current capacitance value of the variable capacitor C3 is equal to its maximum value Cmax or to its minimum value Cmin. More particularly, if the capacitance values of variable capacitor C3 are scanned in the increasing order, it is checked whether the current capacitance value of variable capacitor C3 is equal to its maximum value Cmax, and, if the capacitance values of variable capacitor C3 are scanned in the decreasing order, it is checked whether the current capacitance value of variable capacitor C3 is equal to its minimum value Cmin.

If this is the case (branch Y of block 912), the method continues at step 914. If this is not the case (branch N of block 912), the process continues at step 906.

Step 914 comprises selecting a capacitance value of the variable capacitor C3 making it possible to adapt the impedance of the device 1' to that of the source of the sub-GHz RF signal. Variable capacitor C3 is then controlled so that it takes the selected capacitance value. For this, a set of capacitance values of the variable capacitor C3 corresponding to the minimum measured voltage Vmes is determined from among all the capacitance values taken by the variable capacitor C3 during the preceding steps, then a capacitance value of the variable capacitor C3 is selected from this set.

The implementation of the method described in relation with FIG. 4 allows for adapting the impedance of the device 1' to that of the source of the sub-GHz RF signal.

Indeed, in the case where the set determined in step 914 comprises several capacitance values of variable capacitor C3, these capacitance values all correspond to voltages Vmes measured equal to the voltage Vmin. In other words, these values all correspond to a voltage Vmes on terminal 104 smaller than the voltage Vmin of the ADC. These capacitance values of capacitor C3 therefore all correspond to a coefficient RL smaller than the threshold RLlim.

Further, in the case where the set determined in step 914 includes only one capacitance value, this means that the voltage Vmes corresponding to this capacitance value of the variable capacitor C3 is minimum, and therefore corresponds to a minimum reflected power for the considered device 1'. This case occurs when the voltage Vmes has a minimum value greater than the voltage Vmin of the ADC, that is to say that the coefficient RL remains above threshold RLlim regardless of the capacitance value of the variable capacitor C3. Even in this case, the method described above makes it possible to minimize the power reflected for the device 1' as well as possible, and therefore to adapt the impedance of the device 1' to that of the source of the sub-GHz RF signal. This case corresponds for example to an impedance mismatch for which the normalized impedance of the device 1' does not belong to the area A2 (FIG. 2).

According to one embodiment, the variable component of settable capacitance or inductance value is controlled so that its capacitance or inductance value is equal to a median value of the set determined in step 914. By median value here is meant a value of the set for which the set includes as many values below the median value as there are values above, to within one value.

According to one embodiment, the method is implemented following a request from a user of the device 1' and/or periodically.

According to one embodiment, the method described above is implemented by a microcontroller comprising the ADC which is connected to the terminal 104 of the device 1' and a control circuit of the variable capacitor C3, for example a DAC. The microcontroller includes a microprocessor or processing unit associated with a memory comprising instructions which, when read by the microprocessor of the microcontroller, cause the implementation of the method.

It will be noted that although the implementation of FIG. 3' shows use of a single variable component as a variable capacitor, the single component could instead be one of the inductors. The process described above is equally applicable in the case where the variable component is an inductor and the operation is to determine the inductance value which adapts the impedance of the device 1' to that of the source of the sub-GHz RF signal.

Examples of implementations of the method of FIG. 4 will now be described in relation to FIGS. 5, 6 and 7.

Figure 5:
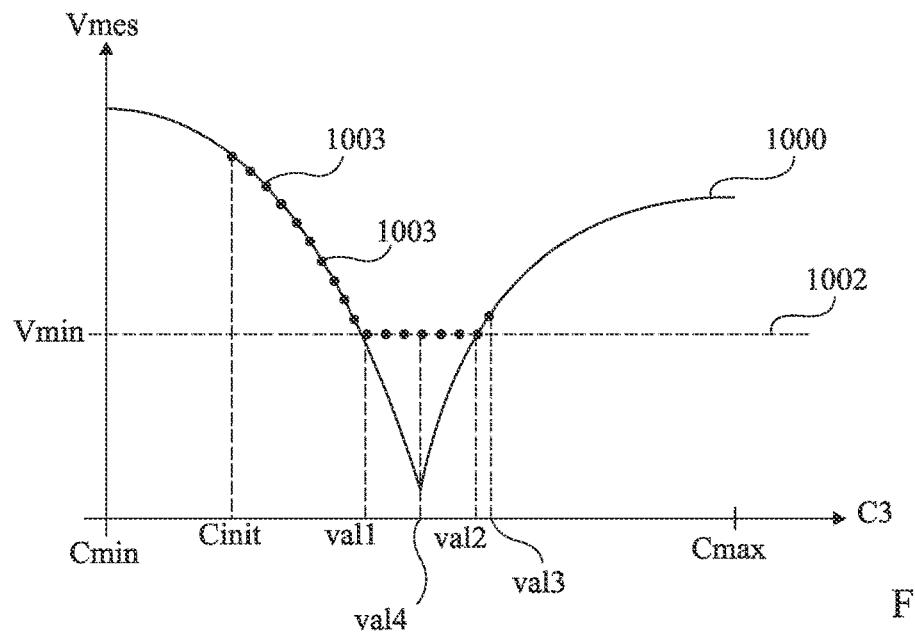
FIG. 5 illustrates an implementation example of the method of FIG. 4.

FIG. 5 illustrates an example of implementation of the method described in relation to FIG. 4. The example of FIG. 5 corresponds to the case where, over the whole range of possible capacitance values of variable capacitor C3, the voltage Vmes on terminal 104 decreases to a minimum value and then increases from this minimum value, and where the minimum value of the voltage Vmes on terminal 104 is smaller than the minimum voltage Vmin of the ADC.

A curve 1000 represents the evolution of the voltage Vmes on the terminal 104 as a function of the capacitance value of the variable capacitor C3 of the network 3'. A horizontal axis 1002 represents the voltage Vmin of the ADC connected to the measurement terminal 104 of the device 1'. Points 1003 represent the voltages Vmes measured by the detector of the device 1', that is to say the measurements of the voltage Vmes supplied by the ADC. In FIG. 5, in order not to overload the figure, a reduced number of points are shown and only two of these points 1003 are referenced. Each point 1003 is obtained for a corresponding capacitance value of the variable capacitor C3 taken during the implementation of the method.

The capacitance value Cinit of the variable capacitor C3 is, in this example, the current capacitance value of the variable capacitor C3 at the start of the method (step 900, FIG. 4), and the capacitance values of the variable capacitor C3 are scanned in the increasing direction (step 902, FIG. 4).

Several measurements of the voltage Vmes (steps 904, FIG. 4) are then carried out by modifying, between each two successive measurements, the capacitance value of the variable capacitor C3 (steps 906, FIG. 4).

Up to a capacitance value val2 of the variable capacitor C3, each measured voltage Vmes is smaller than the previous measured voltage Vmes (step 910, branch N, FIG. 4).

More particularly, in this example, each measurement of the voltage Vmes is strictly smaller than the previous measurement of the voltage Vmes for the successively increasing capacitance values of the variable capacitor C3 ranging from the value Cinit to a value val1, and is equal to the previous measurement of the voltage Vmes for the successively increasing capacitance values of the variable capacitor C3 going from the value val1 to the value val2.

On the other hand, when the variable capacitor C3 changes to a capacitance value val3 following the capacitance value val2 (step 906, FIG. 4), the measured voltage Vmes for the value val3 (step 908, FIG. 4) is strictly greater than the measured voltage Vmes for the value val2 (step 910, branch Y, FIG. 4). As a result, the modifications of the capacitance value of variable capacitor C3 and the measurement of the voltage Vmes for each capacitance value of variable capacitor C3 are stopped, without having scanned all the capacitance values of variable capacitor C3. This makes it possible to reduce the duration of implementation of the method compared to that of a method in which all the capacitance values of the variable capacitor C3 would have been scanned.

Among all the successive capacitance values taken by the variable capacitor C3, the set of capacitance values corresponding to a minimum measured voltage Vmes is then determined (step 914, FIG. 4). In this example, this set includes all the capacitance values of the variable capacitor C3 going from the capacitance value val1 to the capacitance value val2, which all correspond to a voltage Vmes on the terminal 104 smaller than the voltage Vmin, therefore to coefficients RL smaller than the threshold RLlim. A capacitance value val4 of the variable capacitor C3 is then selected from this set, and the variable capacitor C3 is controlled so that its capacitance value is equal to the selected capacitance value.

Preferably, the capacitance value val4 is the median capacitance value of the set. This makes it possible, in the case of FIG. 5, to be closer to the minimum reflected power than if the capacitance value val4 had been selected randomly in the set.

Figure 6:
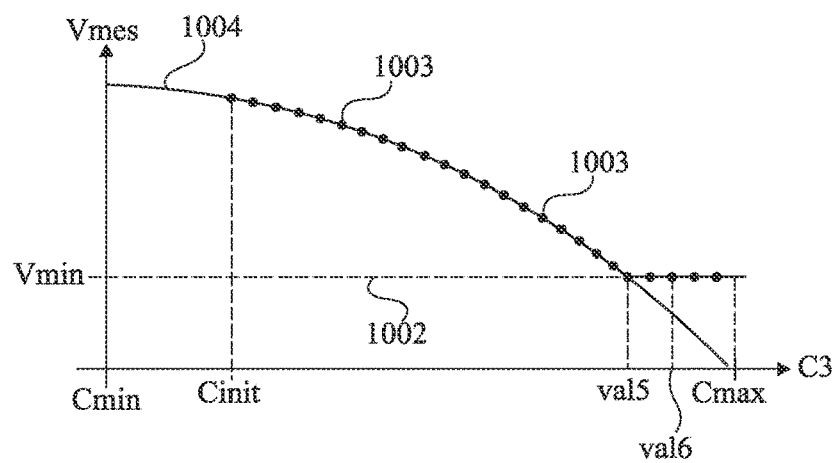
FIG. 6 illustrates another implementation example of the method of FIG. 4.

FIG. 6 illustrates another example of implementation of the method described in relation to FIG. 4. The example of FIG. 6 corresponds to the case where, over the whole range of possible capacitance values of variable capacitor C3, the voltage Vmes is only decreasing when the capacitance values of variable capacitor C3 are scanned in increasing order, and where the voltage Vmes on terminal 104 takes values smaller than the minimum voltage Vmin of the ADC.

A curve 1004 represents the evolution of the voltage Vmes on the terminal 104 as a function of the capacitance value of the variable capacitor C3 of the network 3'. As in FIG. 5, the axis 1002 represents the voltage Vmin and points 1003 represent the voltages Vmes measured by the detector of the device 1', the number of represented points and the number of referenced points being reduced so as not to overload the figure. Each point 1003 is obtained for a corresponding capacitance value of the variable capacitor C3 taken during the implementation of the method.

In this example, the capacitance value Cinit of variable capacitor C3 is the current capacitance value of variable capacitor C3 at the start of the method (step 900, FIG. 4), and the capacitance values of variable capacitor C3 are scanned in increasing order (step 902, FIG. 4).

Several measurements of the voltage Vmes (steps 904, FIG. 4) are carried out by modifying, between each two successive measurements, the capacitance value of the variable capacitor C3 (steps 906, FIG. 4).

Up to the capacitance value Cmax, each measured voltage Vmes is smaller than or equal to the previous measured the voltage Vmes (step 910, branch N, FIG. 4).

More particularly, in this example, each measurement of the voltage Vmes is strictly smaller than the previous measurement of the voltage Vmes for the capacitance values of the variable capacitor C3 ranging from the Cinit value to a capacitance value val5, and is equal to the previous measurement of the voltage Vmes for the capacitance values of the variable capacitor C3 ranging from the capacitance value val5 to the value Cmax.

The set of capacitance values corresponding to a minimum measured voltage Vmes (step 914, FIG. 4) is then determined. In this example, this set includes all the capacitance values of the variable capacitor C3 ranging from the capacitance value val5 to the value Cmax, which all correspond to a voltage Vmes on the terminal 104 smaller than the voltage Vmin, therefore to coefficients RL smaller than the threshold RLlim.

A capacitance value val6 of the variable capacitor C3 is then selected from this set of capacitance values of the variable capacitor C3, and the variable capacitor C3 is controlled so that its capacitance value is equal to the selected capacitance value.

Figure 7:
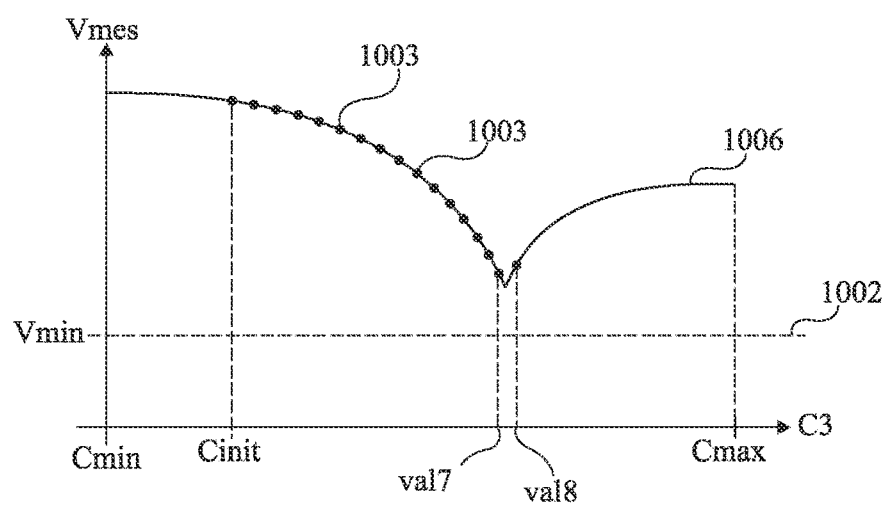
FIG. 7 illustrates yet another implementation example of the method of FIG. 4.

FIG. 7 illustrates yet another example of implementation of the method described in relation to FIG. 4. The example of FIG. 7 corresponds to the case where, over the whole range of possible capacitance values of variable capacitor C3, the voltage Vmes on terminal 104 decreases to a minimum value then increases from this minimum value, and where the minimum voltage Vmes on terminal 104 is greater than the voltage Vmin of the ADC.

A curve 1006 represents the evolution of the voltage Vmes on the terminal 104 as a function of the capacitance value of the variable capacitor C3 of the network 3'. The horizontal axis 1002 represents the voltage Vmin. Points 1003 represent the voltages Vmes measured by the detector of the device 1', the number of represented points and the number of referenced points being reduced so as not to overload the figure. Each point 1003 is obtained for a corresponding capacitance value of the variable capacitor C3 taken during the implementation of the method.

In this example, the capacitance value Cinit of the variable capacitor C3 is the current capacitance value of the variable capacitor C3 at the start of the process (step 900, FIG. 4), and the capacitance values of the variable capacitor C3 are scanned in the increasing direction (step 902, FIG. 4).

Several measurements of the voltage Vmes (steps 904, FIG. 4) are carried out by modifying, between each two successive measurements, the capacitance value of the variable capacitor C3 (steps 906, FIG. 4).

Up to a capacitance value val7, each measured voltage Vmes is strictly smaller than the previous measured voltage Vmes (step 910, branch N, FIG. 4). On the other hand, when the variable capacitor C3 takes a capacitance value val8 following the value val7 (step 906, FIG. 4), the measurement of the voltage Vmes corresponding to the capacitance value val8 (step 908, FIG. 4) is strictly greater than the previous measurement of the voltage Vmes corresponding to the capacitance value val7 (step 910, branch Y, FIG. 4). As a result, the modifications of the capacitance value of variable capacitor C3 and the measurement of the voltage Vmes for each capacitance value of variable capacitor C3 are stopped, without having scanned all the capacitance values of variable capacitor C3. This makes it possible to reduce the duration of implementation of the method compared to that of a method in which all the capacitance values of the variable capacitor C3 would have been scanned.

The set of capacitance values corresponding to a minimum measurement of the voltage Vmes (step 914, FIG. 4) here only includes the capacitance value val7. The variable capacitor C3 is then controlled so that its capacitance value is equal to this single capacitance value val7 of the set.

Embodiments and variants for which threshold RLlim is equal to −13 dB, have been described hereabove. It will be within the abilities of those skilled in the art to modify the value of threshold RLlim. For example, the value of threshold RLlim may be decreased by providing to increase power Pi to respect RLlim=Ds+C−Pi, coupling losses C and the sensitivity Ds of the detector being intrinsic characteristics of device 1' which depend on the coupler 4 and on the ADC used.

Various embodiments and variants have been described. Those skilled in the art will understand that certain features of these various embodiments and variants may be combined, and other variants will occur to those skilled in the art. In particular, the implementation of network 3' is not limited to the example shown in FIG. 3, and it will be within the abilities of those skilled in the art to provide other examples of networks 3' comprising a plurality of inductive and/or capacitive components, including a single variable component of settable (capacitance or inductance) value, and will know how to implement the method described in relation with FIG. 4 for these other examples.

Finally, the practical implementation of the described embodiments and variations is within the abilities of those skilled in the art based on the functional indications given hereabove. In particular, those skilled in the art will know how to vary the value of the adjustable value component, for example with a constant step. As an example, when the component is controlled by an output voltage of a digital to analog converter, this constant step is for example determined by the variation of the output voltage of the converter between two successive binary codes supplied at the input of the converter.

The invention claimed is:

1. A method for determining an inductance or capacitance value of a variable component within an impedance matching network comprising a plurality of fixed components having fixed inductance and capacitance values and said variable component having a variable inductance or capacitance value, comprising:
   determining inductance and capacitance values of the fixed components so that a normalized impedance after an impedance mismatch caused by presence of a proximate conductive element belongs to an area in a Smith chart determined by all inductance or capacitance values of the variable component; and then:
   a) selecting an initial inductance or capacitance value of the variable component and obtaining a measurement of a voltage indicative of power of a reflected signal received by said impedance matching network; and
   b) changing the inductance or capacitance value of the variable component in a determined scanning direction and obtaining a further measurement of the voltage indicative of power of the reflected signal;
   wherein step b) is repeated until said further measured voltage is strictly greater than a penultimately obtained measurement of the voltage indicative of power of the reflected signal.

2. The method according to claim 1, further comprising, after step b):
   c) determining a set comprising each inductance or capacitance value of the variable component corresponding to a minimal voltage measurement; and
   d) controlling the variable component to set its inductance or capacitance value to belong to said set.

3. The method according to claim 2, wherein steps a), b) and c) are implemented in a periodic manner.

4. The method according to claim 2, wherein steps a), b) and c) are implemented in response to a user request.

5. The method according to claim 1, wherein determining comprises:
   1) Determining inductance and capacitance values of the fixed components for which an impedance matches that of a source of a radiofrequency signal applied to the impedance matching network in an anechoic environment;
   2) Calculating a normalized impedance for each inductance or capacitance value of the variable component;
   3) Proximately disposing a conductive element and calculating a further normalized impedance; and
   4) Repeating steps 2) and 3) with a modification of at least one of the inductance and capacitance values selected at step 1) as long as the further normalized impedance calculated at step 3) is outside a set comprising all the normalized impedance calculated at step 2).

6. The method according to claim 1, wherein determining comprises:
   1) Determining inductance and capacitance values of the fixed components for which an impedance matches that of a source of a radiofrequency signal applied to the impedance matching network in an anechoic environment;
   2) Calculating a normalized impedance for each inductance or capacitance values of the variable component;
   3) Proximately disposing a conductive element and calculating a further normalized impedance; and
   4) Repeating steps 2) and 3) with a modification of the inductance or capacitance value of the variable component as long as the further normalized impedance calculated at step 3) is outside a set comprising all the normalized impedance calculated at step 2).

7. The method according to claim 1, wherein the variable component is a capacitor.

8. The method according to claim 1, wherein the variable component is the only component in the impedance matching network which variable.

9. A method for determining an inductance or capacitance value of a variable component within an impedance matching network comprising a plurality of fixed components having fixed inductance and capacitance values and said variable component having a variable inductance or capacitance value, comprising:
   a) selecting an initial inductance or capacitance value of the variable component and obtaining a measurement of a voltage indicative of power of a reflected signal received by said impedance matching network;
   b) changing the inductance or capacitance value of the variable component in a determined scanning direction and obtaining a further measurement of the voltage indicative of power of the reflected signal;
   c) determining a set comprising each inductance or capacitance value of the variable component corresponding to a minimal voltage measurement; and
   d) controlling the variable component to set its inductance or capacitance value at a median value of said set;
   wherein step b) is repeated until said further measured voltage is strictly greater than a penultimately obtained measurement of the voltage indicative of power of the reflected signal.

10. The method according to claim 9, wherein steps a), b) and c) are implemented in a periodic manner.

11. The method according to claim 9, wherein steps a), b) and c) are implemented in response to a user request.

12. The method according to claim 9, further comprising, prior to step a):
   determining inductance and capacitance values of the fixed components so that a normalized impedance after an impedance mismatch caused by presence of a proximate conductive element belongs to an area in a Smith chart determined by all inductance or capacitance values of the variable component.

13. The method according to claim 12, wherein determining comprises:
   1) Determining inductance and capacitance values of the fixed components for which an impedance matches that of a source of a radiofrequency signal applied to the impedance matching network in an anechoic environment;
   2) Calculating a normalized impedance for each inductance or capacitance value of the variable component;
   3) Proximately disposing a conductive element and calculating a further normalized impedance; and
   4) Repeating steps 2) and 3) with a modification of at least one of the inductance and capacitance values selected at step 1) as long as the further normalized impedance calculated at step 3) is outside a set comprising all the normalized impedance calculated at step 2).

14. The method according to claim 12, wherein determining comprises:
   1) Determining inductance and capacitance values of the fixed components for which an impedance matches that of a source of a radiofrequency signal applied to the impedance matching network in an anechoic environment;
   2) Calculating a normalized impedance for each inductance or capacitance values of the variable component;
   3) Proximately disposing a conductive element and calculating a further normalized impedance; and
   4) Repeating steps 2) and 3) with a modification of the inductance or capacitance value of the variable component as long as the further normalized impedance calculated at step 3) is outside a set comprising all the normalized impedance calculated at step 2).

15. The method according to claim 9, wherein the variable component is a capacitor.

16. The method according to claim 9, wherein the variable component is the only component in the impedance matching network which variable.

17. A method for determining an inductance or capacitance value of a variable component within an impedance matching network comprising a plurality of fixed components having fixed inductance and capacitance values and said variable component having a variable inductance or capacitance value, comprising:
   determining inductance and capacitance values of the fixed components so that a normalized impedance after an impedance mismatch caused by presence of a proximate conductive element belongs to an area in a Smith chart determined by all inductance or capacitance values of the variable component and then:
   a) selecting an initial inductance or capacitance value of the variable component and obtaining a measurement of a voltage indicative of power of a reflected signal received by said impedance matching network;
   b) changing the inductance or capacitance value of the variable component in a determined scanning direction and obtaining a further measurement of the voltage indicative of power of the reflected signal; and
   c) repeating step b) until a minimal of the voltage indicative of power of the reflected signal is detected.

18. The method according to claim 17, further comprising:
   determining a set of inductance or capacitance values of the variable component corresponding to the detected minimal of the voltage indicative of power of the reflected signal; and
   setting an inductance or capacitance value of the variable component to one of the inductance or capacitance values belonging to said set.

19. The method according to claim 17, further comprising:
   determining a set of inductance or capacitance values of the variable component corresponding to the detected minimal of the voltage indicative of power of the reflected signal; and
   setting an inductance or capacitance value of the variable component to equal a median of the inductance or capacitance values belonging to said set.

20. The method according to claim 17, wherein determining comprises:
   1) Determining inductance and capacitance values of the fixed components for which an impedance matches that of a source of a radiofrequency signal applied to the impedance matching network in an anechoic environment;
   2) Calculating a normalized impedance for each inductance or capacitance value of the variable component;
   3) Proximately disposing a conductive element and calculating a further normalized impedance; and 4) Repeating steps 2) and 3) with a modification of at least one of the inductance and capacitance values selected at step 1) as long as the further normalized impedance calculated at step 3) is outside a set comprising all the normalized impedance calculated at step 2).

21. The method according to claim 17, wherein determining comprises:
   1) Determining inductance and capacitance values of the fixed components for which an impedance matches that of a source of a radiofrequency signal applied to the impedance matching network in an anechoic environment;
   2) Calculating a normalized impedance for each inductance or capacitance values of the variable component;
   3) Proximately disposing a conductive element and calculating a further normalized impedance; and
   4) Repeating steps 2) and 3) with a modification of the inductance or capacitance value of the variable component as long as the further normalized impedance calculated at step 3) is outside a set comprising all the normalized impedance calculated at step 2).

22. The method according to claim 17, wherein the variable component is a capacitor.

23. The method according to claim 17, wherein the variable component is the only component in the impedance matching network which variable.

* * * * *